United States Patent
Hishiya et al.

(10) Patent No.: US 8,122,850 B2
(45) Date of Patent: Feb. 28, 2012

(54) METHOD AND APPARATUS FOR PROCESSING POLYSILAZANE FILM

(75) Inventors: Shingo Hishiya, Tokyo (JP); Kimiya Aoki, Tokyo (JP); Masahisa Watanabe, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 272 days.

(21) Appl. No.: 12/496,349

(22) Filed: Jul. 1, 2009

(65) Prior Publication Data

US 2009/0263292 A1    Oct. 22, 2009

Related U.S. Application Data

(62) Division of application No. 10/956,125, filed on Oct. 4, 2004, now Pat. No. 7,563,481.

(30) Foreign Application Priority Data

Oct. 6, 2003  (JP) ................................. 2003-347420

(51) Int. Cl.
*C23C 16/00* (2006.01)
*C23C 16/52* (2006.01)
*B05D 3/02* (2006.01)
*B05D 3/04* (2006.01)
*B05D 3/10* (2006.01)

(52) U.S. Cl. ......... 118/696; 118/704; 118/715; 118/724

(58) Field of Classification Search .................. 118/696, 118/704, 715, 724; 427/248.1
See application file for complete search history.

(56) References Cited

U.S. PATENT DOCUMENTS

| | | | |
|---|---|---|---|
| 5,564,889 A | 10/1996 | Araki | |
| 5,907,382 A | 5/1999 | Kajiura et al. | |
| 5,914,151 A | 6/1999 | Usuki | |
| 6,762,126 B2* | 7/2004 | Cho et al. | 438/694 |
| 6,903,030 B2* | 6/2005 | Ishii et al. | 438/782 |
| 7,563,481 B2* | 7/2009 | Hishiya et al. | 427/248.1 |
| 7,879,397 B2* | 2/2011 | Watanabe et al. | 427/248.1 |
| 7,972,979 B2* | 7/2011 | Harada et al. | 438/787 |
| 2002/0020433 A1 | 2/2002 | Suemura et al. | |
| 2002/0160614 A1* | 10/2002 | Cho et al. | 438/694 |
| 2003/0106495 A1* | 6/2003 | Asano et al. | 118/724 |
| 2003/0113657 A1 | 6/2003 | Nagahara et al. | |

(Continued)

FOREIGN PATENT DOCUMENTS

JP      10-321719      12/1998

(Continued)

OTHER PUBLICATIONS

Office Action issued Nov. 18, 2010, in Taiwanese Patent Application No. 093127787, (wit English translation).

*Primary Examiner* — Jeffrie R Lund

(74) *Attorney, Agent, or Firm* — Oblon, Spivak, McClelland, Maier & Neustadt, L.L.P.

(57) ABSTRACT

A method of processing a polysilazane film includes a first heat process and a subsequent second heat process performed on a target substrate with a polysilazane coating film formed thereon. The first heat process is performed by supplying water vapor into a process area within a reaction container, which accommodates the target substrate, while setting the process area at a first temperature of from 390° C. to 410° C. The second heat process is performed by supplying water vapor into the process area, while setting the process area at a second temperature of from 600° C. to 800° C.

12 Claims, 12 Drawing Sheets

U.S. PATENT DOCUMENTS

| | | | |
|---|---|---|---|
| 2004/0168638 A1* | 9/2004 | Ishii et al. | 118/724 |
| 2005/0056220 A1* | 3/2005 | Aoki et al. | 118/722 |
| 2007/0231484 A1* | 10/2007 | Hishiya et al. | 427/248.1 |
| 2008/0139001 A1* | 6/2008 | Watanabe et al. | 438/773 |
| 2009/0263292 A1* | 10/2009 | Hishiya et al. | 422/116 |
| 2011/0065288 A1* | 3/2011 | Harada et al. | 438/791 |

FOREIGN PATENT DOCUMENTS

| | | |
|---|---|---|
| JP | 11/105186 | 4/1999 |
| JP | 11-105187 | 4/1999 |
| JP | 2002-25999 | 1/2002 |
| JP | 2004-273519 | 9/2004 |
| KR | 2002-0068672 | 8/2002 |

* cited by examiner

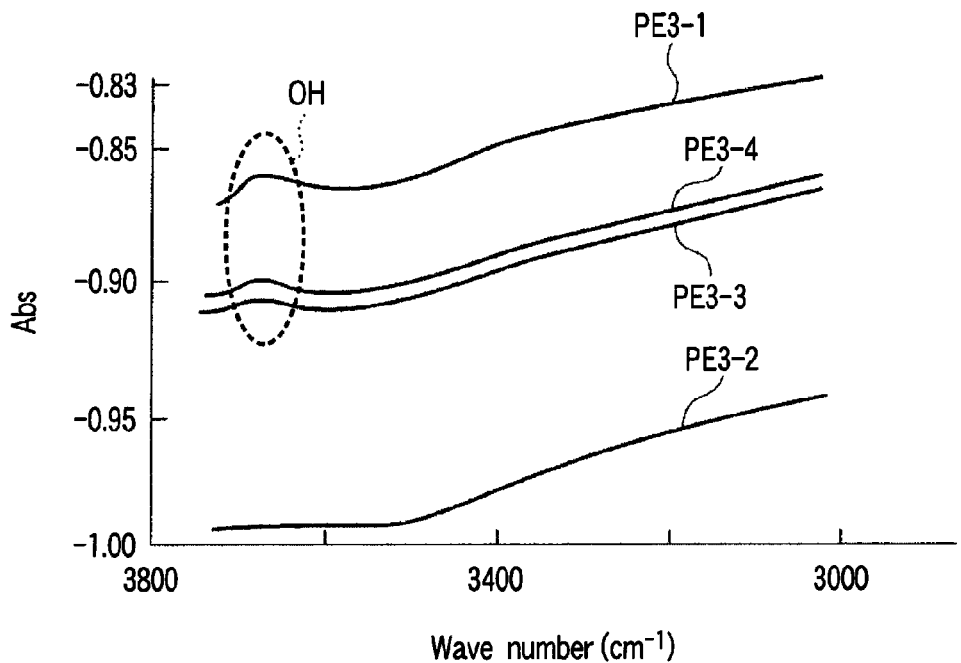
F I G. 8
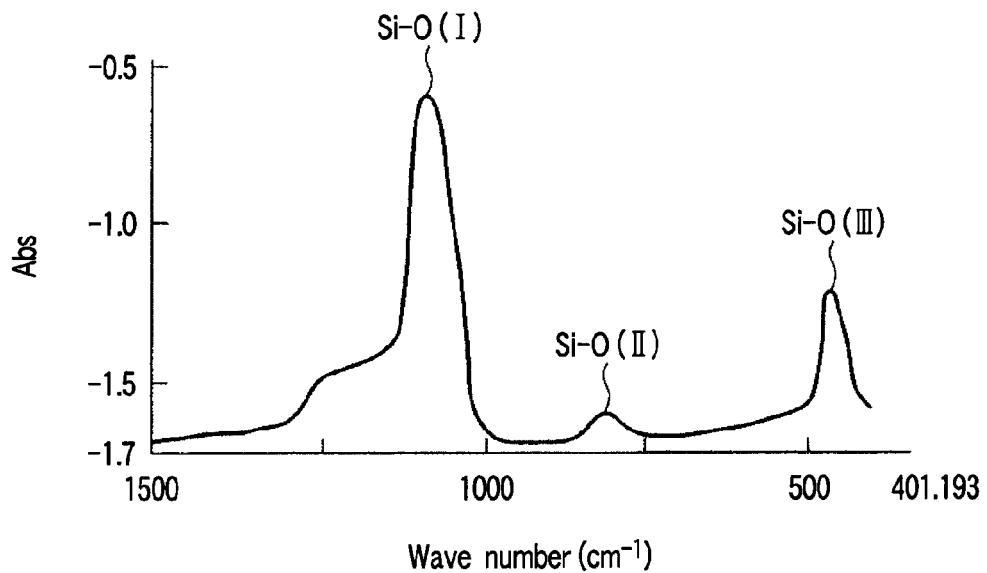
F I G. 9

| PE | Si-O (I) area | Si-O (II) area | Si-O (III) area |
|---|---|---|---|
| $SiO_2$ | 112.67 | 5.35 | 16.24 |
| 4-1 | 48.36 | 1.91 | 5.94 |
| 4-2 | 57.28 | 2.73 | 7.93 |
| 4-3 | 52.21 | 2.39 | 6.73 |
| 4-4 | 51.79 | 2.29 | 6.59 |
| 4-5 | 57.26 | 2.76 | 7.96 |
| 4-6 | 57.18 | 2.77 | 7.99 |
| 4-7 | 52.22 | 2.51 | 7.08 |
| 4-8 | 52.07 | 2.47 | 6.85 |
| 4-9 | 52.96 | 2.53 | 6.89 |
| 4-10 | 52.23 | 2.53 | 6.77 |

FIG. 10

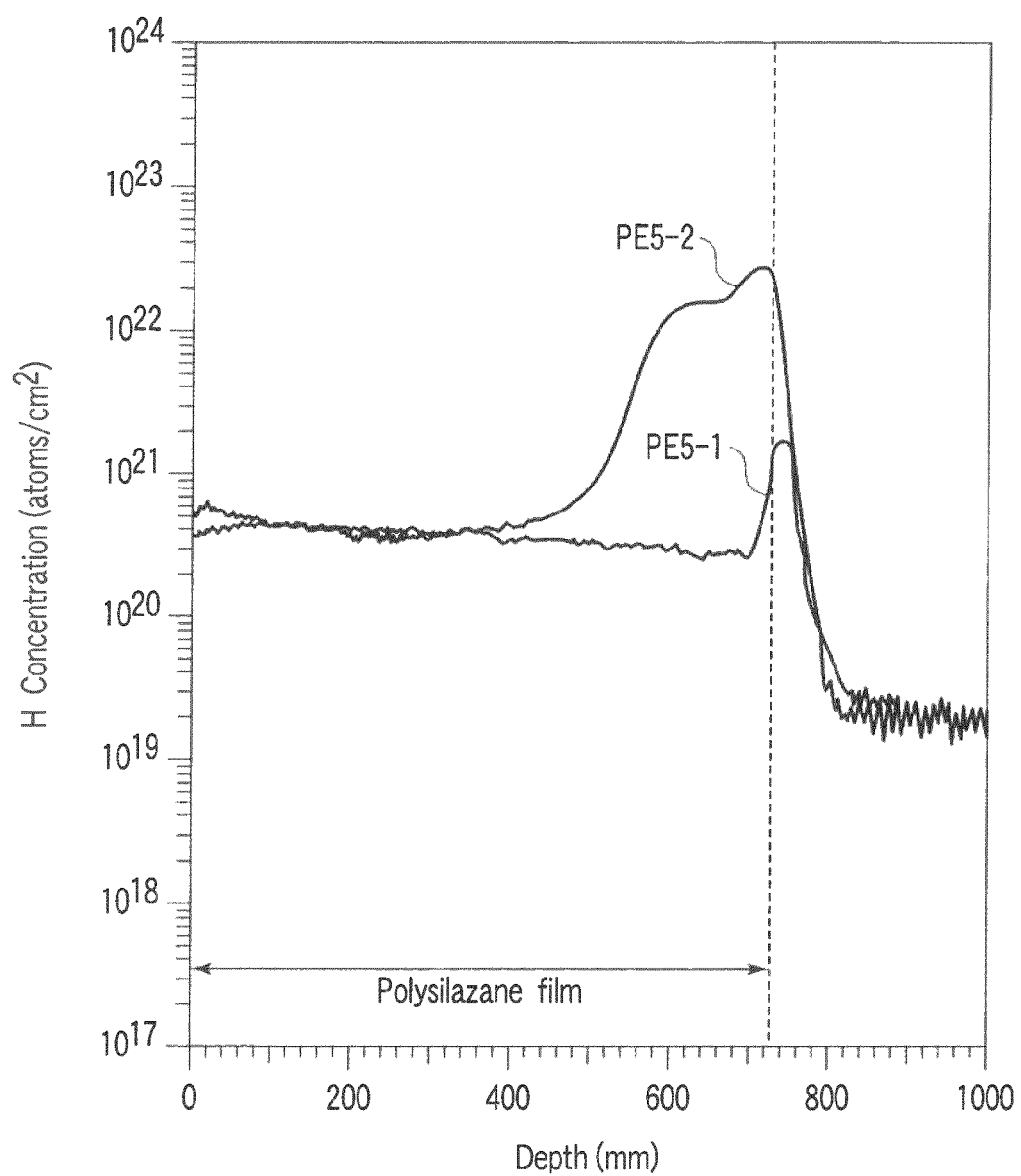
F I G. 12

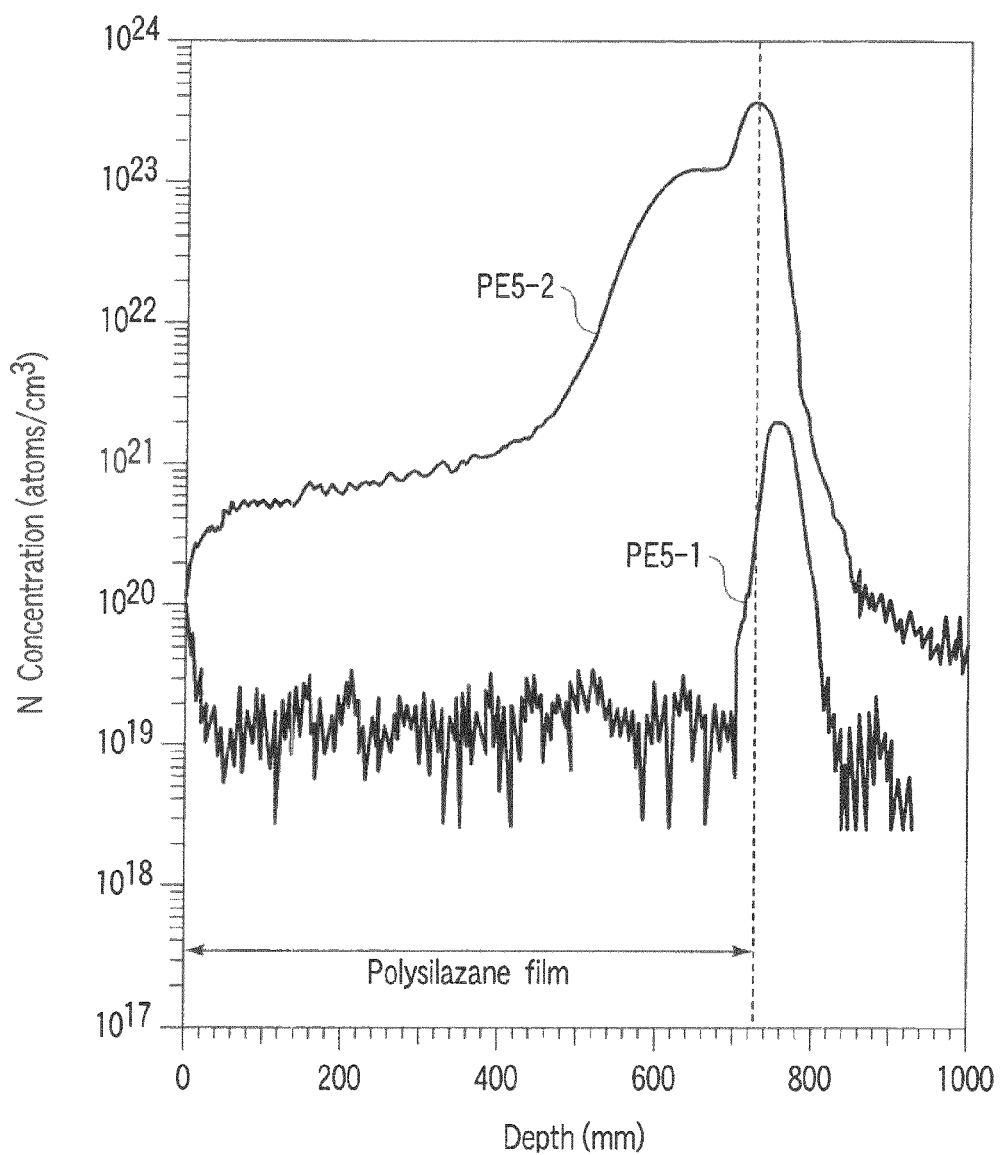
F I G. 13

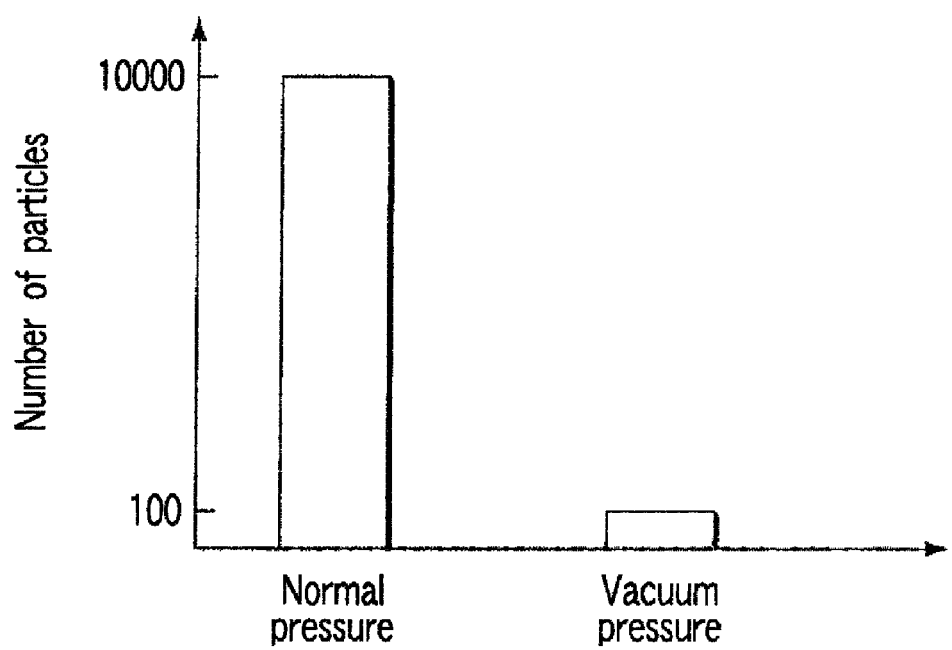
F I G. 14
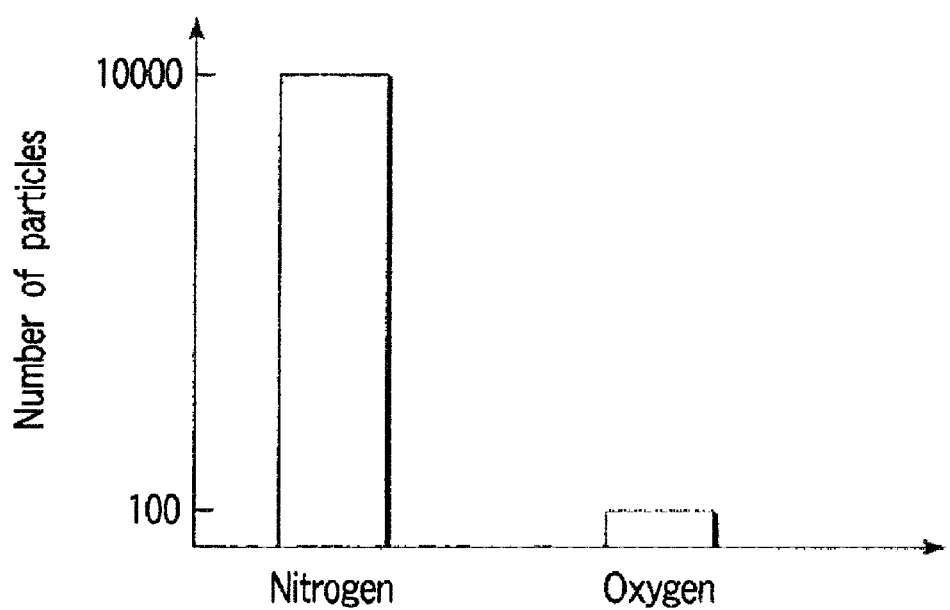
F I G. 15

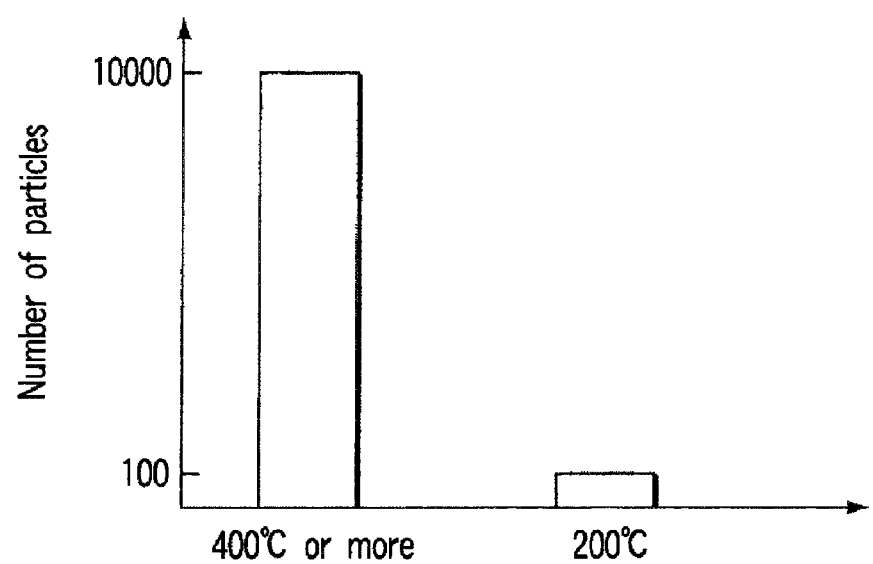
F I G. 16
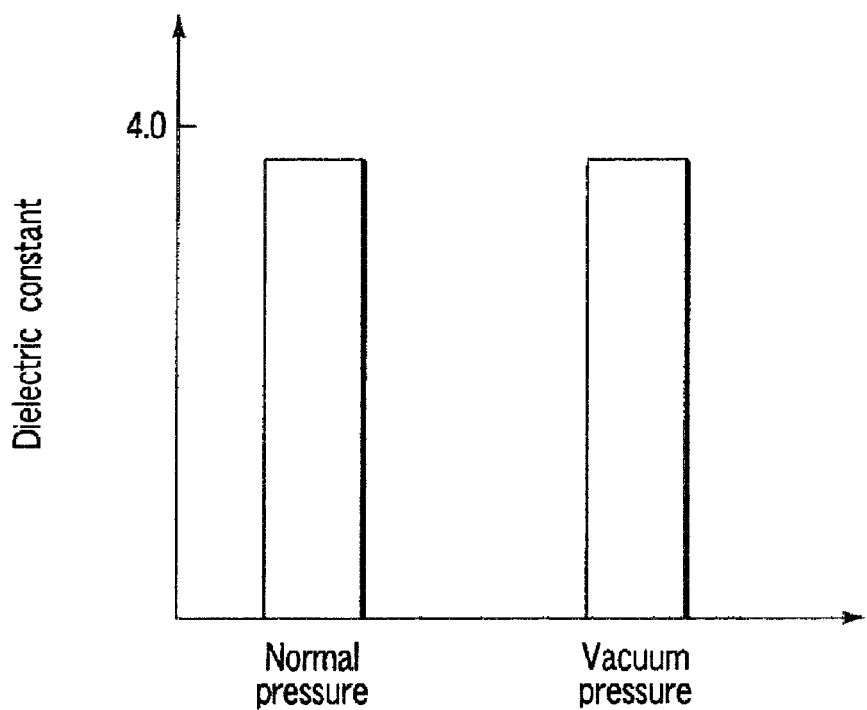
F I G. 17

METHOD AND APPARATUS FOR PROCESSING POLYSILAZANE FILM

CROSS-REFERENCE TO RELATED APPLICATIONS

This application is a Divisional of application Ser. No. 10/956,125, filed Oct. 4, 2004 which is based upon and claims the benefit of priority from prior Japanese Patent Application No. 2003-347420, filed Oct. 6, 2003, the entire contents of which are incorporated herein by reference.

BACKGROUND OF THE INVENTION

1. Field of the Invention

The present invention relates to a method and apparatus for processing a polysilazane film disposed on a target substrate, such as a silicon wafer.

2. Description of the Related Art

In general, a silicon oxide film ($SiO_2$ film) is used as an insulating film, such as a device isolation film or inter-level insulating film, for semiconductor devices. As methods of forming a silicon oxide film of this kind, a BPSG (Boron Phospho-Silicate Glass) method, ozone TEOS (TetraEthyl Ortho-Silicate) method, USG (Undoped Silicate Glass) method, and HDP (High Density Plasma enhanced chemical vapor deposition) method are known.

In recent years, semiconductor devices have become smaller with the increase in integration, thereby increasing the aspect ratio of trenches for STI (Shallow Trench Isolation) and recesses, e.g., gaps between members thereof. Where a method, such as BPSG method, ozone TEOS method, or HDP method, as described above, is used to form an $SiO_2$ film to fill a recess having a high aspect ratio, a problem arises such that the $SiO_2$ film is very poor in filling the recess (step coverage).

In order to improve the step coverage for a recess having a high aspect ratio, it has been researched to use a polysilazane film as a device isolation film or inter-level insulating film. Where a polysilazane film is formed, a polysilazane coating solution is applied onto a target substrate, and is then subjected to a heat process, thereby forming a polysilazane film.

Jpn. Pat. Appln. KOKAI Publication No. 10-321719 (see Paragraph No. 0077) discloses a method of forming a polysilazane film of this kind. According to this method, a film of polysilazane coating solution is subjected to a first heat process at a temperature of from 100° C. to 250° C. to vaporize its organic solvent. Then, the film is subjected to a second heat process at a temperature of 550° C. or less, such as 400° C., to cure the film, thereby forming a polysilazane film or insulating film. However, in practice, where this method is used to form a polysilazane film, the film is brittle and therefore difficult to use as a device isolation film or inter-level insulating film.

BRIEF SUMMARY OF THE INVENTION

An object of the present invention is to provide a method and apparatus for processing a polysilazane film, so that the polysilazane film becomes good in step coverage for a recess and high in density, and thus has good film qualities, such as electric properties and dielectric constant, used for an insulating film.

According to a first aspect of the present invention, there is provided a method of processing a polysilazane film, comprising:

supplying water vapor into a process area within a reaction container, which accommodates a target substrate with a polysilazane coating film formed thereon, while setting the process area at a first temperature of from 390° C. to 410° C., to perform a first heat process on the target substrate; and subsequently to the first heat process, supplying water vapor into the process area, while setting the process area at a second temperature of from 600° C. to 800° C., to perform a second heat process on the target substrate.

The method according to the first aspect may further comprise, prior to the first heat process, supplying water vapor into the process area, while setting the process area at a preliminary temperature lower than the first temperature, to perform a preliminary process on the target substrate.

The method according to the first aspect may further comprise, subsequently to the second heat process, stopping supply of water vapor into the process area, and setting the process area at a third temperature of from 800° C. to 1000° C., to perform a third heat process on the target substrate.

According to a second aspect of the present invention, there is provided a method of processing a polysilazane film, comprising:

supplying a first process gas into a process area within a reaction container, which accommodates a target substrate with a polysilazane coating film formed thereon, while setting the process area at a first temperature of from 390° C. to 410° C., to perform a first heat process on the target substrate, the first process gas comprising ozone or oxygen gas and hydrogen gas separately supplied into the reaction container; and subsequently to the first heat process, supplying a second process gas into the process area, while setting the process area at a second temperature of from 600° C. to 800° C., to perform a second heat process on the target substrate, the second process gas comprising ozone or oxygen gas and hydrogen gas separately supplied into the reaction container.

According to a third aspect of the present invention, there is provided an apparatus for processing a polysilazane film, comprising:

a reaction container having a process area configured to accommodate a target substrate with a polysilazane coating film formed thereon;

a heater configured to heat the process area;

an exhaust system configured to exhaust the reaction container;

a supply system configured to supply a process gas into the reaction container, the supply system comprising a portion configured to supply water vapor into the reaction container; and a controller configured to control an operation of the apparatus, wherein the controller executes supplying water vapor into the process area, while setting the process area at a first temperature of from 390° C. to 410° C., to perform a first heat process on the target substrate; and subsequently to the first heat process, supplying water vapor into the process area, while setting the process area at a second temperature of from 600° C. to 800° C., to perform a second heat process on the target substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a characteristic diagram showing the relationship between the baking conditions and FT-IR spectrum of a polysilazane film;

FIG. 9 is a characteristic diagram showing the FT-IR spectrum of a polysilazane film;

FIG. 10 is a diagram showing peak areas due to Si—O bonds in the FT-IR spectrum of a polysilazane film;

FIG. 12 is a characteristic diagram showing the H-concentration in a polysilazane film obtained by a SIMS analysis;

FIG. 13 is a characteristic diagram showing the N-concentration in a polysilazane film obtained by a SIMS analysis;

FIG. 14 is a diagram showing the relationship between the pressure condition in heat-processing and the number of deposited particles;

FIG. 15 is a diagram showing the relationship between the atmosphere in the reaction container in loading wafers into the reaction container and the number of deposited particles;

FIG. 16 is a diagram showing the relationship between the temperature in the reaction container in loading wafers into the reaction container and the number of deposited particles; and FIG. 17 is a diagram showing the relationship between the pressure condition in heat-processing and the dielectric constant of a polysilazane film.

DETAILED DESCRIPTION OF THE INVENTION

Figure 1A:
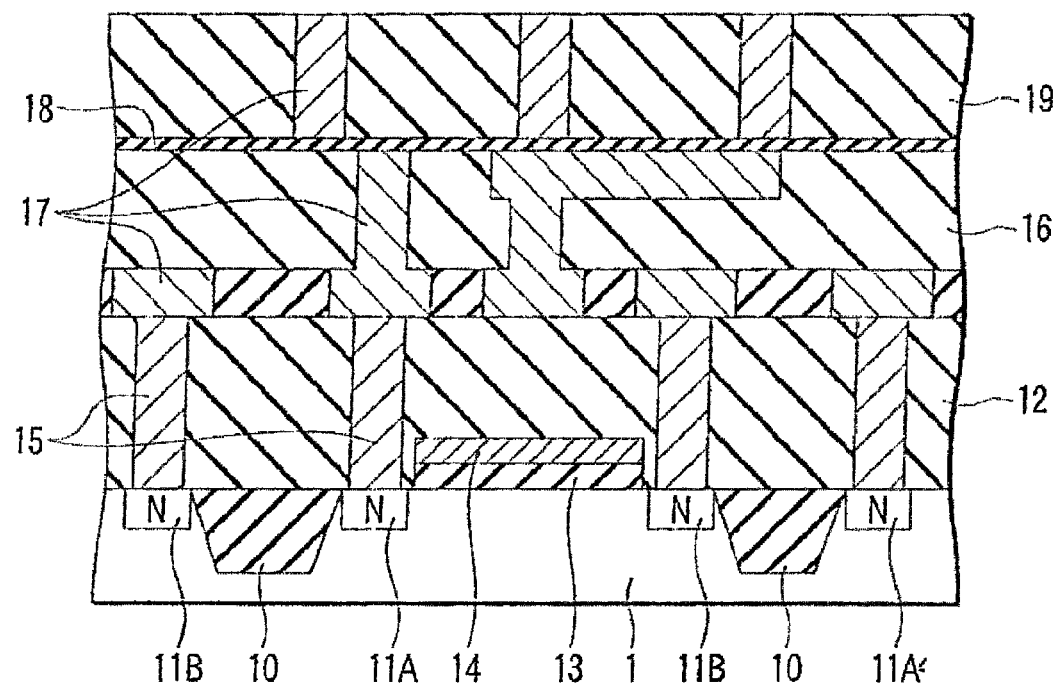
FIGS. 1A and 1B are a sectional view showing the structure of a semiconductor device including a polysilazane film, and an enlarged view showing a part thereof, respectively.

Embodiments of the present invention will now be described with reference to the accompanying drawings. In the following description, the constituent elements having substantially the same function and arrangement are denoted by the same reference numerals, and a repetitive description will be made only when necessary.

Figure 1B:
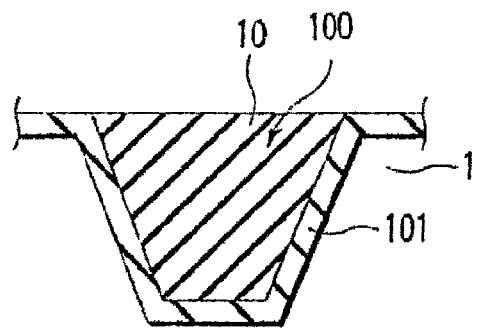

FIGS. 1A and 1B are a sectional view showing the structure of a semiconductor device including a polysilazane film, and an enlarged view showing a part thereof, respectively. In FIGS. 1A and 1B, there is a semiconductor substrate 1 formed of, e.g., a P-type silicon (Si) substrate. The surface of the semiconductor substrate 1 is provided with $N^+$-type source layers 11A and $N^+$-type drain layers 11B formed therein, and device isolation films 10 each filling a recess 100 to form an STI structure. A gate oxide film 13 formed of, e.g., a silicon oxide film, and a gate electrode 14 formed of, e.g., a polysilicon film are disposed on the semiconductor substrate 1 in this order. The gate oxide film 13 and gate electrode 14 are covered with a first inter-level insulating film 12 disposed on the semiconductor substrate 1.

Metal wiring layers 17 made of, e.g., Cu (copper) or Al (aluminum) are disposed on the first inter-level insulating film 12. The $N^+$-type source layers 11A and $N^+$-type drain layers 11B are connected to the Cu wiring layers 17 through plug layers 15 made of W (tungsten). A second inter-level insulating film 16 is disposed on the first inter-level insulating film 12. A third inter-level insulating film 19 is disposed on the second inter-level insulating film 16 with a hard mask 18 formed of, e.g., a nitride film, interposed therebetween. In this example, the inner surface of each recess 100 of the STI structure is covered with an oxide film 101, on which the device isolation film 10 is disposed.

Figure 2:
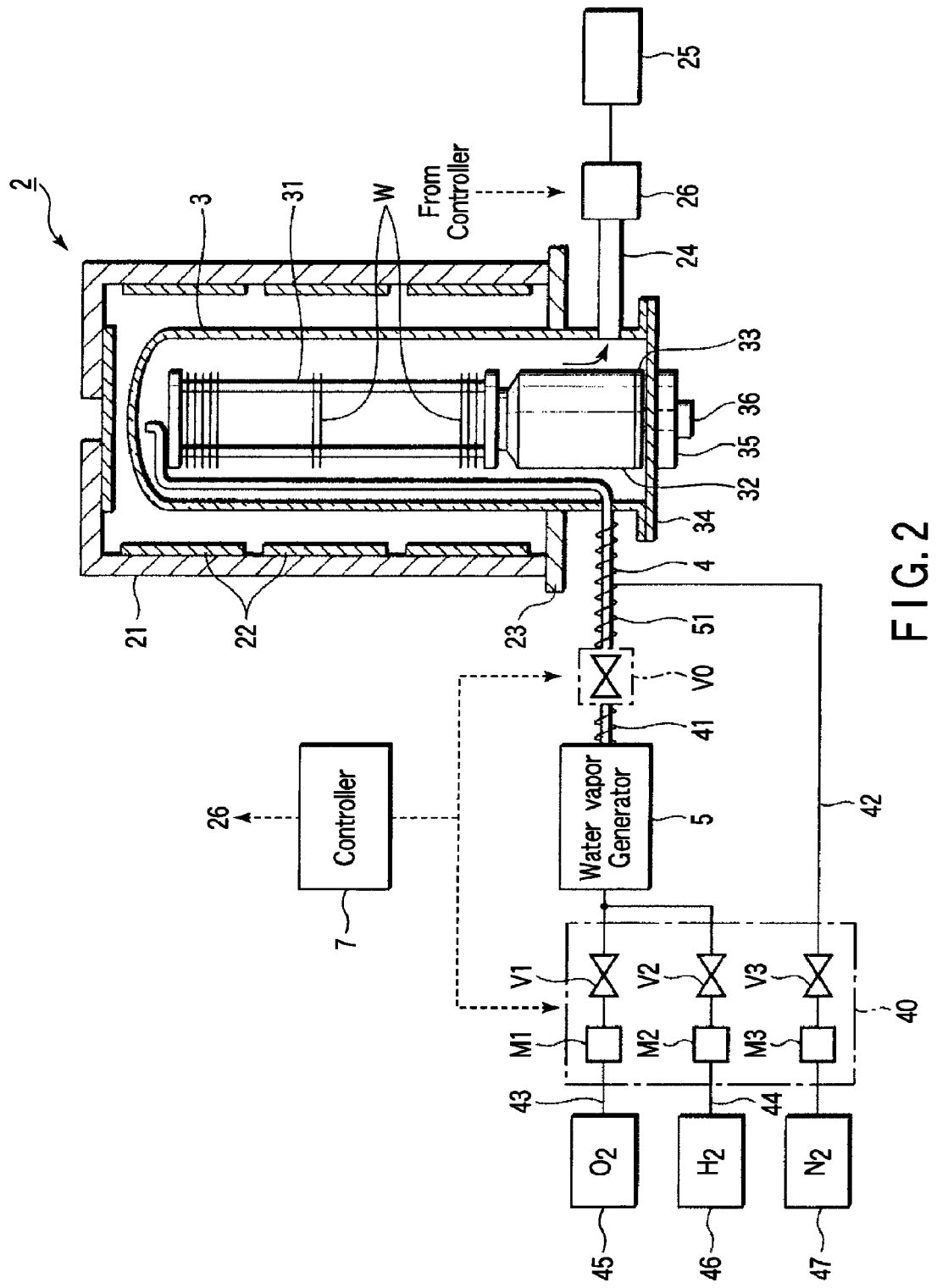
FIG. 2 is a structural view showing a vertical heat processing apparatus according to an embodiment of the present invention.

FIG. 2 is a structural view showing a vertical heat processing apparatus according to an embodiment of the present invention. As shown in FIG. 2, this apparatus includes a vertical heating furnace 2 fixed to a base body 23 at the bottom. The heating furnace 2 is formed of, e.g., a cylindrical insulating body 21, which is provided with a ceiling and heating means disposed inside. For example, the heating means is formed of heaters 22 of the resistance heating type, which are disposed circumferentially along the inner wall-surface of the insulating body 21. The process area (heat-processing atmosphere area) is divided into a plurality of zones in the vertical direction, and the heaters 22 are respectively disposed at the zones, so that the zones can be controlled in heating independently of each other. A reaction tube (reaction container or process chamber) 3 made of, e.g., quartz is disposed inside the heating furnace 2. The reaction tube 3 has a vertical structure with a closed top, in which the process area is defined. The reaction tube 3 is fixed to the base body 23.

This vertical heat processing apparatus also includes a wafer boat 31 or holder to hold a plurality of, e.g., 100, target substrates, such as semiconductor wafers W, in a state where they are stacked at intervals. The wafer boat 31 is placed on a lid 34 through a heat insulator or insulating cylinder 32 and a turntable 33. The lid 34 is attached to a boat elevator 35, and is used to open and close a port at the bottom of the reaction tube 3. The boat elevator 35 is provided with a rotation mechanism 36 to rotate the turntable 33 along with the wafer boat 31. The boat elevator 35 is moved up and down, so that the wafer boat 3 is loaded and unloaded into and from the reaction tube 3.

A gas supply pipe 4 extending from a gas supply system 40 is inserted into the bottom of the reaction tube 3 from the outside. For example, the gas supply pipe 4 extends vertically upward in the reaction tube 3 and is bent at the distal end to spout a process gas toward the ceiling of the reaction tube 3 near the center thereof. On the other hand, as shown in FIG. 2, the upstream side of the gas supply pipe 4 is bifurcated into a first gas supply pipe 41 and a second gas supply pipe 42.

The first gas supply pipe 41 is provided with a water vapor generator 5 used as water vapor generating means. The first gas supply pipe 41 is further divided into an oxygen ($O_2$) gas supply pipe 43 and a hydrogen ($H_2$) gas supply pipe 44 at an upstream position from the water vapor generator 5. The proximal side of the oxygen gas supply pipe 43 is connected to an oxygen gas supply source 45 through a valve V1 and a mass-flow controller M1. The proximal side of the hydrogen gas supply pipe 44 is connected to a hydrogen gas supply source 46 through a valve V2 and a mass-flow controller M2.

The proximal side of the second gas supply pipe 42 is connected to a nitrogen gas supply source 47 used as a diluting gas (inactive gas) supply source, through a valve V3 and a mass-flow controller M3. The mass-flow controllers M1 to M3 are used as flow rate adjusting means for adjusting gas supply flow rates.

The first gas supply pipe 41 is provided with a valve V0 at a downstream position from the water vapor generator 5. The downstream portions of the gas supply pipes 4 and 41 are provided with a heater or heating means, such as a wrapping tape heater 51, to heat them to prevent water vapor from condensing.

The water vapor generator 5 has heating means for heating a gas passing therethrough. A catalyst, such as platinum, is disposed in the gas passage of the water vapor generator 5. In the water vapor generator 5, oxygen gas and hydrogen gas are heated to a predetermined temperature of, e.g., 500° C. or less, and come into contact with the catalyst. As a consequence, in the presence of the catalyst, oxygen gas and hydrogen gas react with each other and generate water vapor. The water vapor generator 5 can set the concentration of water vapor to be about 1% to 90% in the mixture of water vapor and oxygen gas within the reaction tube 3 set at a vacuum pressure.

An exhaust pipe 24 having an inner diameter of, e.g., 3 inches is connected to the bottom of the reaction tube 3. The proximal side of the exhaust pipe 24 is connected to a vacuum pump 25 used as pressure-reducing means. The exhaust pipe 24 is provided with pressure adjusting means 26. In this embodiment, the pressure adjusting means 26 includes a main valve for opening and closing the exhaust pipe 24, as well as a device for adjusting pressure, such as a butterfly valve.

This vertical heat processing apparatus includes a controller (controlling means) 7, such as a computer. The controller 7 has functions for controlling the heater 22, gas supply system 40, pressure adjusting means 26, and so forth. The valves V0 to V3 and mass-flow controllers M1 to M3 of the gas supply system 40 are operated to control the supply, stop, and flow rate of the gases. In order to control components of the gas supply system 40, the controller 7 transmits control signals to the respective controllers (not shown) of the components. The controller 7 stores a recipe that contains process parameters and process sequences, and a program to read the recipe. In accordance with the program, the flow rates of oxygen gas, hydrogen gas, and nitrogen gas, heater 22, and pressure adjusting means 26 are controlled in heating steps after wafers W are loaded into the reaction tube 3, as described later.

Figure 3:
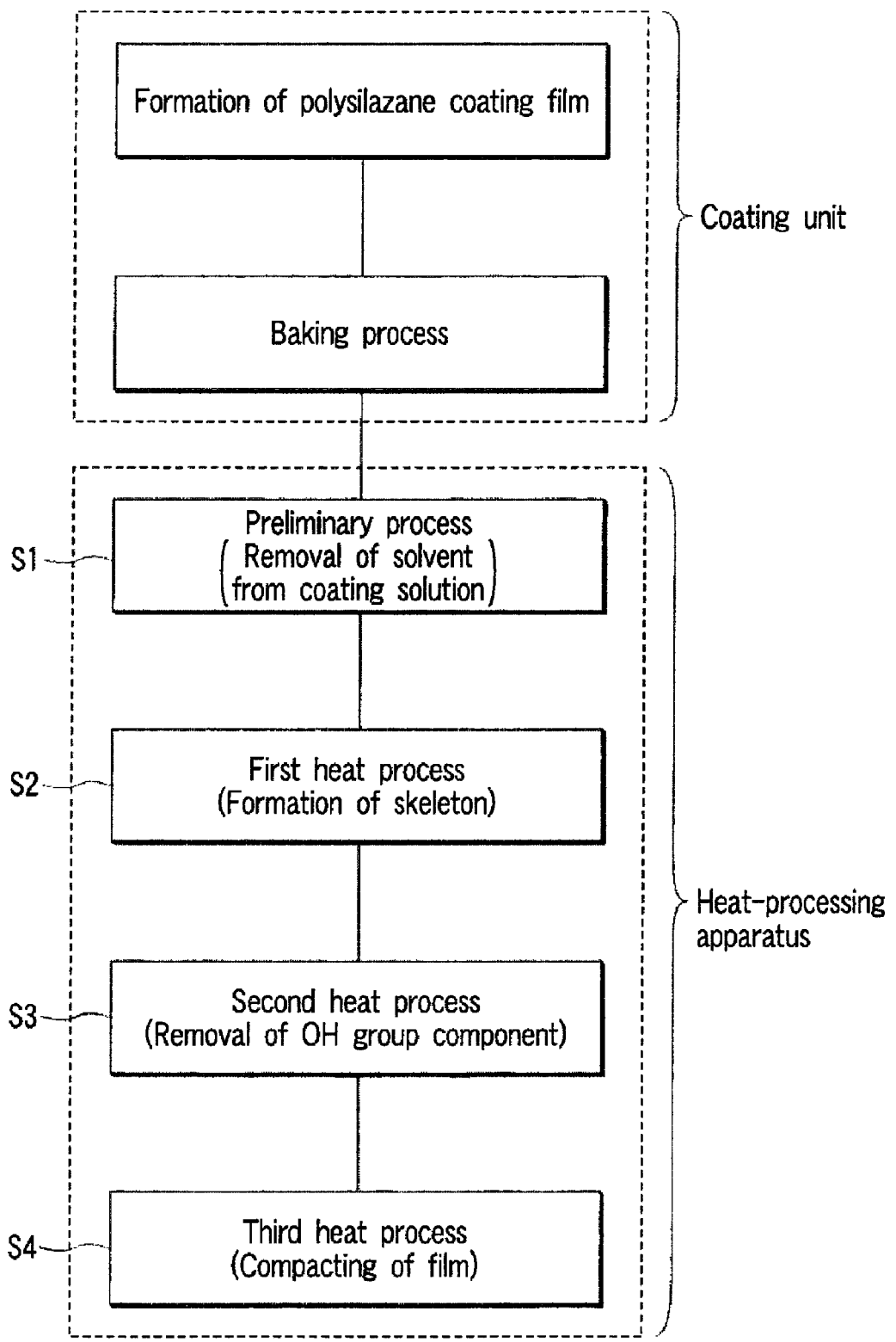
FIG. 3 is a flowchart for explaining a method for processing a polysilazane film according to an embodiment of the present invention.
Figure 4:
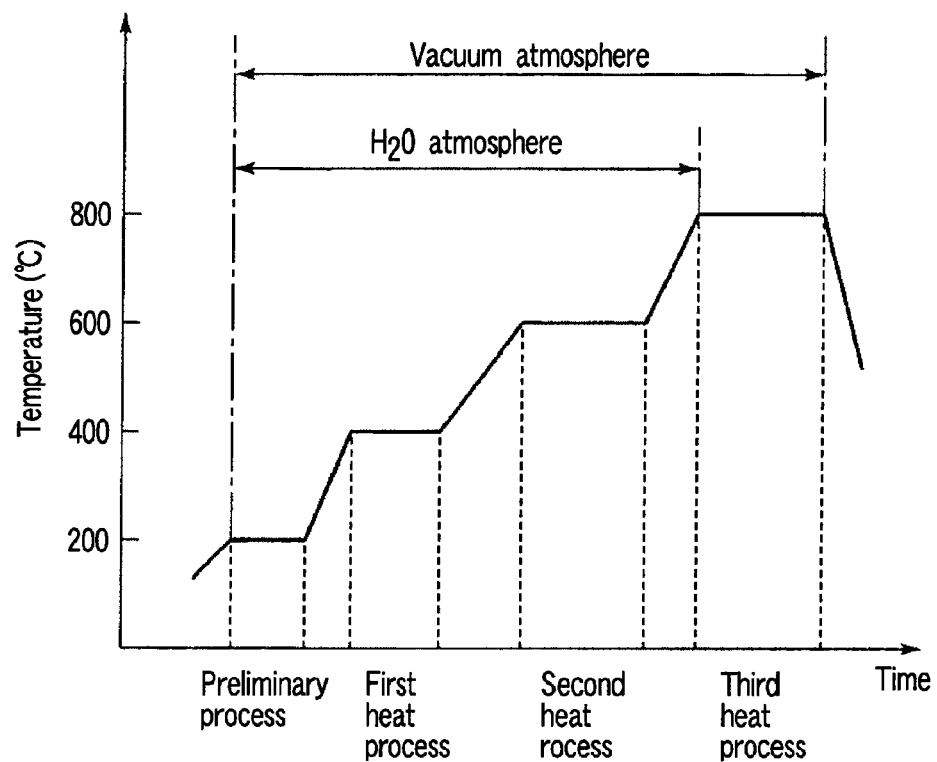
FIG. 4 is a diagram showing the temperature and the state inside a reaction container, in the steps of the processing method shown in FIG. 3.

Next, with reference to FIGS. 3 and 4, an explanation will be given of a method for processing a polysilazane film, performed in the apparatus shown in FIG. 2. In this embodiment, the polysilazane film is used as a device isolation film 10 or a first inter-level insulating film 12 disposed below metal wiring in a semiconductor device, as that shown in FIG. 1A. FIG. 3 is a flowchart for explaining a method for processing a polysilazane film according to an embodiment of the present invention. FIG. 4 is a diagram showing the temperature and the state inside a reaction container, in the steps of the processing method shown in FIG. 3.

First, the interior of the reaction tube 3 is set at a temperature of, e.g., 150° C., and is purged with oxygen gas by opening the valve V1 and valve V0 without bringing the water vapor generator 5 in operation. Along with this state, wafers W are transferred from a wafer storing container or wafer carrier C onto the wafer boat 31 by a wafer transfer device (not shown). At this time, the wafers W, such as totally 100 wafers W, are transferred one by one, or one set by one set each formed of a plurality, e.g., 5 wafers, in descending order from the upper side of the wafer boat 31.

In steps prior to this transfer, each wafer W is provided with coating solution on the surface, which contains a polysilazane (—(SiR1-NR2)n—: R1 and R2 represent alkyl groups) component and a solvent, and applied thereon by, e.g., a spin coating method in a coating unit. Then, for example, the coating film thus formed is subjected to a baking process at a temperature of about 150° C. for 3 minutes to remove the solvent in the coating solution. Then, the wafers W each provided with such a coating film are transferred onto the wafer boat 31, as described above.

After the transfer of the wafers W is completed, the wafer boat 31 is moved up and loaded into the reaction tube 3. The port at the bottom of the reaction tube 3 is closed by the lid 34. The interior of the reaction tube 3 is vacuum-exhausted (pressure-reducing by exhaust) to set the pressure in the reaction tube 3 at, e.g., 53200 Pa (400 Torr). After the wafer boat 31 is loaded, the valves V0, V1, and V2 are opened, and the water vapor generator 5 is brought in operation. As a consequence, in the water vapor generator 5, oxygen gas and hydrogen gas react with each other in the presence of the catalyst and generate water vapor, which is then supplied into the reaction tube 3.

At this time, the flow rates of oxygen gas and hydrogen gas are set at, e.g., 2650 sccm and 3500 sccm, respectively, so that the reaction tube 3 can be supplied with the necessary amount of water vapor for baking the polysilazane film formed on the wafers W, e.g., 100 wafers. As a consequence, the moisture concentration in the process area with a vacuum pressure atmosphere is set at, e.g., 80%.

Then, while the pressure and gas supply conditions are maintained, the heater 22 is controlled to heat up the interior of the reaction tube 3 to a preliminary process temperature of, e.g., 200° C., at an average heating-up rate of 1° C./minute to 200° C./minute, and a preliminary process (preliminary heat process) is started. This process is preformed for about 30 minutes, while the interior of the reaction tube 3 is maintained at a temperature of 200° C. and a pressure of 53200 Pa (step S1).

With this preliminary process, solvent and impurities left in the polysilazane coating film on the surface of the wafers W are removed. In other words, this preliminary process is performed to complement the baking process performed in the coating unit. The preliminary process is preferably set such that the process temperature is 150° C. to 390° C., the pressure in the reaction tube 3 is 133 Pa (1 Torr) to 101080 Pa (760 Torr), and the moisture concentration inside the reaction tube 3% is 80%.

Then, while the pressure and gas supply conditions are maintained, the heater 22 is controlled to heat up the interior of the reaction tube 3 to a first temperature of, e.g., 400° C., at an average heating-up rate of 1° C./minute to 200° C./minute, and a first heat process is started. This process is preformed for about 30 minutes, while the interior of the reaction tube 3 is maintained at a temperature of 400° C. and a pressure of 53200 Pa (step S2).

As described above, this heat process is preformed for about 30 minutes under a moisture concentration of 80%, a vacuum pressure state of about 53200 Pa, and a temperature near 400° C. As a consequence, impurities such as nitrogen (N), carbon (C), and hydrogen (H), are removed, and the skeleton of the polysilazane film is thereby formed. In order to remove impurities to form the skeleton of the polysilazane film, the first heat process is preferably set such that the process temperature is 390° C. to 410° C., the processing time is 5 minutes to 60 minutes, the pressure in the reaction tube is 133 Pa to 101080 Pa, and the moisture concentration is 1 to 90%.

Then, while the pressure and gas supply conditions are maintained, the heater 22 is controlled to heat up the interior of the reaction tube 3 to a second temperature of, e.g., 600° C., at an average heating-up rate of 1° C./minute to 200° C./minute, and a second heat process is started. This process is preformed for about 30 minutes, while the interior of the reaction tube 3 is maintained at a temperature of 600° C. and a pressure of 53200 Pa (step S3).

As described above, this heat process is preformed for about 30 minutes under a moisture concentration of 80%, a vacuum pressure state of about 53200 Pa, and a temperature near 600° C. As a consequence, components based on OH groups, such as alcohols, contained in the polysilazane film are removed. In order to effectively remove components, such as alcohols, from the polysilazane film, the second heat process is preferably set such that the process temperature is 600° C. to 800° C., the processing time is 5 minutes to 60 minutes, the pressure in the reaction tube is 133 Pa to 101080 Pa, and the moisture concentration is 1% to 90%.

Then, the valve V0 to V3 is closed to stop the supply of water vapor into the reaction tube 3, and the gas in the reaction tube 3 is replaced with nitrogen gas. Immediately after this, while the vacuum pressure state is maintained, the heater 22 is controlled to heat up the interior of the reaction tube 3 to a third temperature of, e.g., 800° C., at an average heating-up rate of 1° C./minute to 200° C./minute, and a third heat process is started. This process is preformed for about 30 minutes, while the interior of the reaction tube 3 is maintained at a temperature of 800° C. and a pressure of 53200 Pa (step S4).

As described above, this heat process is preformed for about 30 minutes under a vacuum pressure state of about 53200 Pa, and a temperature near 800° C. As a consequence, the polysilazane film is compacted. The third heat process is preferably set such that the process temperature is 800° C. to 1000° C., the processing time is 5 minutes to 60 minutes, and the pressure in the reaction tube is 133 Pa to 101080 Pa.

Then, the interior of the reaction tube 3 is cooled to, e.g., 400° C., and is then purged with nitrogen gas and returned to atmospheric pressure. Then, the wafer boat 31 is moved down and unloaded from the reaction tube 3. Then, with a transfer operation reverse to that described with reference to FIG. 3, the wafers W are taken out by the transfer device, in ascending order from the lower side of the wafer boat 31. These sequential steps described above are performed in accordance with a program and recipe in the controller 7.

According to this embodiment, the following effects are obtained. Specifically, since the polysilazane film is a plastered film, it has good step coverage for a recess having a high aspect ratio, thereby allowing a coating film with no voids or seams. Further, the wafers with a polysilazane coating film formed thereon are heat-processed in the four different stages while increasing the temperature stepwise, as analyzed below. As a consequence, it is possible to form a polysilazane film with high density and hardness, and with properties effective for a device isolation film 10 in a STI structure or a first inter-level insulating film 12.

Specifically, first, in the preliminary process, a heat process is performed at a temperature of 200° C. within a water vapor atmosphere, whereby solvent components and impurities left in the polysilazane coating solution are removed. Then, in the first heat process, a heat process is performed at a temperature of 400° C. within a water vapor atmosphere at a vacuum pressure, whereby impurities are removed, and the skeleton of the polysilazane film is formed. By contrast, if the film were to be rapidly heated up to a temperature of, e.g., about 700° C., higher than the first temperature, without performing the first heat process, the formed polysilazane film would come to show a poor Vfb-film thickness characteristic, which is an electrical characteristic of the film, and to contain a large quantity of impurities, as shown in experimental examples described later. One of the reasons for this seems to reside in that the reaction to form the skeleton of the polysilazane film does not proceed, if the film is rapidly heated up to a temperature higher than the first temperature. Another reason is thought such that, since the film is baked in a state where it contains impurities, such as $NH_3$ and $SiH_4$, having not removed, properties of the film deteriorate.

Then, in the second heat process, a heat process is performed at a temperature of 600° C. within a water vapor atmosphere at a vacuum pressure, whereby components containing OH groups, such as alcohols, are removed from the polysilazane film. By contrast, if the film were to be subjected to only the first heat process without performing the second heat process, the formed film would come to have a low density, thus becomes fragile. In this case, even if the processing time were to be prolonged, the formed film would come to show a poor Vfb-film thickness characteristic, as shown in experimental examples described later, and could not be used as a device isolation film 10 or first inter-level insulating film 12, in practice. A reason for this is thought to be that, since the polysilazane film contains a large quantity of OH groups, components based on OH groups, such as alcohols, remain therein, thus bring about an under-baked state.

Then, in the third heat process, a heat process is performed at a temperature of 800° C. within a vacuum pressure atmosphere, whereby the polysilazane film is compacted. As described above, components, such as alcohols, are removed after the $SiO_2$ skeleton is formed, whereby a polysilazane film is formed to have high density and hardness, along with a Vfb-film thickness characteristic and dielectric constant almost the same as those of an oxide film ($SiO_2$ film). Such a polysilazane film is effectively used as an insulating film, such as a device isolation film 10 or first inter-level insulating film 12. Furthermore, the heat processes are performed stepwise, and the amount of carbon removed from the film is increased, whereby the formed polysilazane film contains a smaller quantity of impurities, and thus is improved in dielectric constant and electrical properties.

According to the embodiment described above, each of the preliminary process, first heat process, second heat process, and third heat process is performed while the pressure in the reaction tube 3 is set at about 53200 Pa by vacuum-exhausting the reaction tube 3. In this case, particle production within the reaction tube 3 is suppressed, and the wafers are prevented from being contaminated by particles. Specifically, during each of the preliminary process to third heat process, the wafers are heated and thereby emit therefrom gases, such as ammonia, hydrogen, and silane. These gases are adsorbed on the wafers by vapor-phase reaction and produce particles of the $SiO_2$ family. In order to prevent this, the interior of the reaction tube 3 is kept vacuum-exhausted to exhaust the gas within the reaction tube 3 through the exhaust passage. As a consequence, the gases described above that can produce particles are effectively exhausted, so that particle production is suppressed.

Particles may cause problems in subsequent steps. Where 100 wafers are processed together as in the heat processing apparatus shown in FIG. 2, the wafers emit a large amount of gas. Accordingly, it is effective to perform the heat processes under a reduced pressure. In this case, since the vacuum pressure state is used to prevent particle production, the pressure in the reaction tube is preferably set at, e.g., about 133 Pa to 93100 Pa (700 Torr).

According to the embodiment described above, each of the preliminary process, first heat process, and second heat process is performed within a water vapor atmosphere. In each of the preliminary process and first heat process, a heat process is performed at a temperature of 400° C. or less within a water vapor atmosphere. In this case, heat is transmitted throughout the polysilazane film, to the bottom thereof, whereby the film is baked in a good state through to the bottom, and the oxygen concentration in the film becomes higher. A water vapor atmosphere is used for the second heat process, because this condition allows components based on OH groups to be easily removed, so as to form a skeleton similar to that of an $SiO_2$ film.

In the heat processing apparatus described above, the water vapor generator 5 generates water vapor from oxygen gas and hydrogen gas by the agency of a catalyst, whereby the amount of water vapor generated can be controlled within a wide range of from 1% to 90%. Accordingly, the amount of water vapor can be adjusted to a necessary value in accordance with the target quality of a polysilazane film.

According to the embodiment described above, a water vapor atmosphere is not used for the third heat process. This is so, because this embodiment is exemplified by a case where only an oxide film 101 is disposed on the sidewall of a STI structure recess 100, as that shown in FIG. 1B. In this case, when the polysilazane film is formed, the silicon oxide film 101 is exposed. A water vapor atmosphere at a high temperature of 800° C. to 1000° C. is highly oxidative, and thus could oxidize the sidewall of the oxide film 101 and hinder an ideal STI shape. Accordingly, a water vapor atmosphere is preferably not used for the third heat process.

Figure 5:
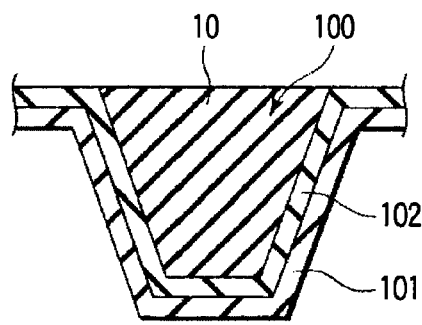
FIG. 5 is a sectional view showing filing materials in an STI structure.

However, in a case where the STI structure shown in FIG. 5 is formed, the third heat process may be performed within a water vapor atmosphere. In FIG. 5, a silicon oxide film 101 and a silicon nitride film 102 are disposed in this order within a STI structure recess 100. A polysilazane film 10 is formed on this nitride film 102. In this case, since the nitride film 102 is hardly oxidized, a water vapor atmosphere may be used for the third heat process. Thus, a certain atmosphere is selected as the atmosphere for the third heat process, in accordance with an underlying film.

According to the embodiment described above, when the wafer boat 31 is loaded into the reaction tube 3, the interior of the reaction tube 3 is set at an oxygen atmosphere. This prevents reaction products (sublimation substances), which are generated from the polysilazane film in loading the wafer boat 31, from being deposited on the wafers. Furthermore, the temperature inside the reaction tube 3 is set at 200° C. or less, e.g., 150° C., when the wafer boat 31 is loaded. This also prevents reaction products (sublimation substances), which are generated from the polysilazane film in loading the wafer boat 31, from being deposited on the wafers.

A polysilazane film may be formed as a film on or above a metal wiring layer of a semiconductor device, such as a second inter-level insulating film 16 or third inter-level insulating film 19, as that shown in FIG. 1A. In this case, the third heat process is not performed, in order to prevent the metal wiring layer of Cu from being agglomerated or to prevent the gate oxide film 13 from suffering a thermal damage, due to a high temperature heat process. Also, the second heat process is preferably performed at a temperature of, e.g., 650° C. or less to prevent the Cu agglomeration or thermal damage.

EXPERIMENTAL EXAMPLES

Next, an explanation will be given of experimental examples performed to examine some effects of the present invention.

Present Examples 1

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. Then, an electrical characteristic (Vfb: flat band voltage) of the polysilazane film was measured by a non-contact CV measuring unit "Quantox (product name)". In this experiment, various heat process conditions were used for present examples in processing the polysilazane film, as follows.

Present Example (PE)1-1

Only the first heat process was applied for 30 minutes, at 400° C. and normal pressure (101080 Pa), within a water vapor atmosphere (moisture concentration 80%). This result is indicated with "◇" in FIG. 6.

Present Example (PE)1-2

Only the second heat process was applied for 30 minutes, at 700° C. and normal pressure, within a water vapor atmosphere the same as that of PE1-1. This result is indicated with "◆" in FIG. 6.

Present Example (PE)1-3

The first heat process was applied for 30 minutes, at 320° C., and the second heat process was then applied for 30 minutes, at 700° C., both at normal pressure, within a water vapor atmosphere the same as that of PE1-1. This result is indicated with "○" in FIG. 6.

Present Example (PE)1-4

The first heat process was applied at 390° C., and the second heat process was then applied at 700° C., both at normal pressure, within a water vapor atmosphere the same as that of PE1-1. The processing times of the first and second heat processes were set to be the same as those of PE1-3. This result is indicated with "•" in FIG. 6.

Present Example (PE)1-5

The first heat process was applied at 400° C., and the second heat process was then applied at 700° C., both at normal pressure, within a water vapor atmosphere the same as that of PE1-1. The processing times of the first and second heat processes were set to be the same as those of PE1-3. This result is indicated with "□" in FIG. 6.

Present Example (PE)1-6

The first heat process was applied at 412° C., and the second heat process was then applied at 700° C., both at normal pressure, within a water vapor atmosphere the same as that of PE1-1. The processing times of the first and second heat processes were set to be the same as those of PE1-3. This result is indicated with "■" in FIG. 6.

Present Example (PE)1-7

The first heat process was applied at 500° C., and the second heat process was then applied at 700° C., both at normal pressure, within a water vapor atmosphere the same as that of PE1-1. The processing times of the first and second heat processes were set to be the same as those of PE1-3. This result is indicated with "Δ" in FIG. 6.

Present Example (PE)1-8

The preliminary process was applied for 30 minutes, at 200° C., the first heat process was then applied at 400° C., and the second heat process was then applied at 700° C., all at normal pressure, within a water vapor atmosphere the same as that of PE1-1. Then, the third heat process was applied for 30 minutes, at 850° C. and normal pressure, while $N_2$ gas was supplied at a flow rate of 5000 sccm. The processing times of the first and second heat processes were set to be the same as those of PE1-3. This result is indicated with "▲" in FIG. 6.

Figure 6:
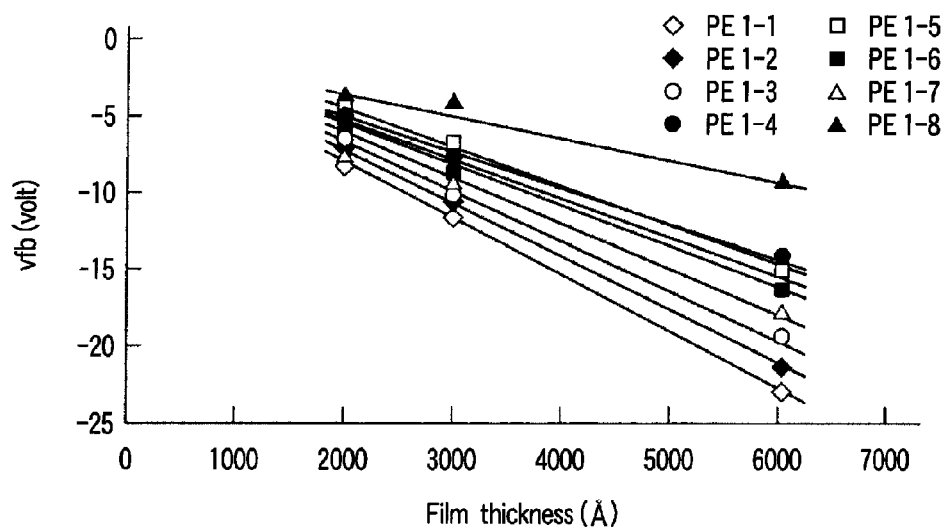
FIG. 6 is a characteristic diagram showing the relationship between the film thickness and electrical properties of a polysilazane film.

FIG. 6 is a characteristic diagram showing the relationship between the film thickness and electrical properties of a polysilazane film, obtained by this experiment. In FIG. 6, the vertical axis denotes the Vfb, and the horizontal axis denotes the film thickness of a polysilazane film. The Vfb is an electrical index that shows whether the properties of the film are close to those of an oxide film ($SiO_2$ film). In relation to the Vfb-film thickness characteristic, as the Vfb is closer to a constant value in spite of variations in the film thickness, the film has better properties close to those of an $SiO_2$ film.

As shown in FIG. 6, the PE1-1 and PE1-2, in which only the first heat process or the second heat process was used for baking a polysilazane film, showed a lower Vfb-film thickness characteristic. Accordingly, it has been found that the electrical properties of a polysilazane film are improved where the first heat process and second heat process are sequentially performed.

Even where the first heat process and second heat process are sequentially performed, the case where the first heat process temperature was set at 320° C. (PE1-3) or 500° C. (PE1-7) brought about properties lower than the case where the first heat process temperature was set at 390° C. (PE1-4), 400° C. (PE1-5), or 412° C. (PE1-6). Accordingly, it has been found that there is an optimum range of the first heat process temperature, and the electrical properties of a film are improved where the first heat process temperature is set at 390° C. to 410° C.

Further, where the preliminary process was performed at 200° C. before the first heat process, and the third heat process was performed at 850° C. after the second heat process, as in PE1-8, the properties of the film were remarkably improved. Accordingly, it has been found that the preliminary process and third heat process are effective.

Present Examples 2

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. Then, an aluminum/copper electrode pattern was formed on the polysilazane film to obtain a sample, which was used to measure the dielectric constant of the polysilazane film by a CV method. In this experiment, various heat process conditions were used for present examples in processing the polysilazane film, as follows.

Present Example (PE)2-1

Only the first heat process was applied for 30 minutes, at 400° C. and normal pressure (101080 Pa), within a water vapor atmosphere (moisture concentration 80%).

Present Example (PE)2-2

Only the second heat process was applied for 30 minutes, at 700° C. and normal pressure, within a water vapor atmosphere the same as that of PE2-1.

Present Example (PE)2-3

The first heat process was applied for 30 minutes, at 400° C., and the second heat process was then applied for 30 minutes, at 800° C., both at normal pressure, within a water vapor atmosphere the same as that of PE2-1.

Present Example (PE)2-4

The first heat process was applied at 400° C., and the second heat process was then applied at 800° C., both at normal pressure, within a water vapor atmosphere the same as that of PE2-1. Then, the third heat process was applied for 30 minutes, at 850° C., while $O_2$ gas and $N_2$ gas were supplied at flow rates of 1800 sccm and 4200 sccm, respectively. The processing times of the first and second heat processes were set to be the same as those of PE2-3.

Present example (PE)2-5

The first heat process was applied at 400° C., and the second heat process was then applied at 800° C., both at normal pressure, within a water vapor atmosphere the same as that of PE2-1. Then, the third heat process was applied for 30 minutes, at 850° C., while $N_2$ gas was supplied at a flow rate of 5000 sccm. The processing times of the first and second heat processes were set to be the same as those of PE2-3.

Figure 7:
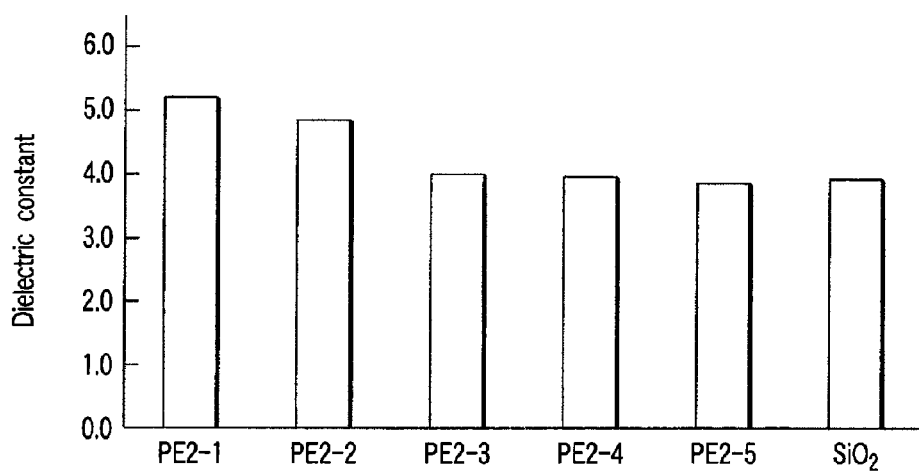
FIG. 7 is a characteristic diagram showing the relationship between the baking conditions and dielectric constant of a polysilazane film.

FIG. 7 is a characteristic diagram showing the relationship between the baking conditions and dielectric constant of a polysilazane film, obtained by this experiment. In FIG. 7, the vertical axis denotes the dielectric constant, and the horizontal axis denotes the heat process conditions of a polysilazane film. FIG. 7 includes, on the right side, data on an $SiO_2$ film formed by a deposition process. Where the dielectric constant of a polysilazane film is close to the dielectric constant of an $SiO_2$ film, the polysilazane film is acceptable.

As shown in FIG. 7, the PE2-1 and PE2-2, in which only the first heat process or the second heat process was used for baking a polysilazane film, showed a higher dielectric constant of the polysilazane film, as compared with the PE2-3, PE2-4, and PE2-5, in which both the first heat process and the second heat process were used for baking a polysilazane film. Accordingly, it has been found that a polysilazane film with a dielectric constant as low as an $SiO_2$ film is formed where the first heat process and second heat process are sequentially performed.

Further, the polysilazane films of the PE2-4 and PE2-5 showed a dielectric constant slightly lower than the polysilazane film of the PE2-3. Accordingly, it has been found that performing the third heat process after the first and second heat processes is effective. In this respect, judging from the result of the PE2-5, it has been found that the dielectric constant of a polysilazane film becomes lower where the third heat process is performed while supplying $N_2$ gas.

Present Examples 3

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. Then, the polysilazane film was subjected to a test to measure the spectrum by an FT-IR (Fourier transform infrared spectroscopy method). In this experiment, various heat process conditions were used for present examples in processing the polysilazane film, as follows.

Present Example (PE)3-1

Only the first heat process was applied for 30 minutes, at 400° C. and normal pressure (101080 Pa), within a water vapor atmosphere (moisture concentration 80%).

Present Example (PE)3-2

The first heat process was applied for 30 minutes, at 400° C., and the second heat process was then applied for 30 minutes, at 800° C., both at normal pressure, within a water vapor atmosphere the same as that of PE3-1.

Present Example (PE)3-3

The first heat process was applied at 400° C., and the second heat process was then applied at 700° C., both at normal pressure, within a water vapor atmosphere the same as that of PE3-1. The processing times of the first and second heat processes were set to be the same as those of PE3-2.

Present Example (PE)3-4

The first heat process was applied at 400° C., and the second heat process was then applied at 600° C., both at normal pressure, within a water vapor atmosphere the same as that of PE3-1. The processing times of the first and second heat processes were set to be the same as those of PE3-2.

FIG. 8 is a characteristic diagram showing the relationship between the baking conditions and FT-IR spectrum of a polysilazane film, obtained by this experiment. FIG. 8 shows a spectrum near the peak due to OH groups, in the measurement result. As the peak due to OH groups is higher, the quantity of components based on OH groups in a polysilazane film is larger.

As shown in FIG. 8, the peak due to OH groups was highest under the conditions of the PE3-1, followed by the PE3-4 and PE3-3 in this order, and the peak did not appear under the conditions of the PE3-2. The same FT-IR spectrum measurement was also performed on an $SiO_2$ film formed by a deposition process, and the peak due to OH groups did not appear. Accordingly, it has been found that the quantity of residual components based on OH groups in a polysilazane film is large where only the first heat process is applied. Further, it has been found that components based on OH groups in a polysilazane film are removed by the second heat process. Furthermore, it has been found that, as the process temperature of the second heat process is higher, components based on OH groups are removed more, so that the structure of a polysilazane film becomes closer to that of an $SiO_2$ film formed by a deposition process.

Present Examples 4

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. Then, the polysilazane film was subjected to a test to measure the spectrum by an FT-IR. The measurement result was used to obtain the areas of three peaks due to Si—O bonds, i.e., Si—O bond (I), Si—O bond (II), and Si—O bond (III), shown in FIG. 9. In this experiment, various heat process conditions were used for present examples in processing the polysilazane film, as follows.

Present Example (PE)4-1

Only the first heat process was applied for 30 minutes, at 400° C. and normal pressure (101080 Pa), within a water vapor atmosphere (moisture concentration 80%).

Present Example (PE)4-2

The first heat process was applied for 30 minutes, at 400° C., and the second heat process was then applied for 30 minutes, at 800° C., both at normal pressure, within a water vapor atmosphere the same as that of PE4-1.

Present Example (PE)4-3

The first heat process was applied at 400° C., and the second heat process was then applied at 700° C., both at normal pressure, within a water vapor atmosphere the same as that of PE4-1. The processing times of the first and second heat processes were set to be the same as those of PE4-2.

Present Example (PE)4-4

The first heat process was applied at 400° C., and the second heat process was then applied at 600° C., both at normal pressure, within a water vapor atmosphere the same as that of PE4-1. The processing times of the first and second heat processes were set to be the same as those of PE4-2.

Present Example (PE)4-5

The first heat process was applied at 400° C., and the second heat process was then applied at 800° C., both at normal pressure, within a water vapor atmosphere the same as that of PE4-1. Then, the third heat process was applied for 30 minutes, at 850° C., while oxygen gas and nitrogen gas were supplied at flow rates of 1800 sccm and 4200 sccm, respectively. The processing times of the first and second heat processes were set to be the same as those of PE4-2.

Present Example (PE)4-6

The first heat process was applied at 400° C., and the second heat process was then applied at 800° C., both at normal pressure, within a water vapor atmosphere the same as that of PE4-1. Then, the third heat process was applied at 850° C. and normal pressure as in the PE4-5, while nitrogen gas was supplied at a flow rate of 5000 sccm. The processing times of the first, second, and third heat processes were set to be the same as those of PE4-5.

Present Example (PE)4-7

The first heat process was applied at 400° C., and the second heat process was then applied at 700° C., both at normal pressure, within a water vapor atmosphere the same as that of PE4-1. Then, the third heat process was applied at 850° C. and normal pressure as in the PE4-5, while oxygen gas and nitrogen gas were supplied at flow rates of 1800 sccm and 4200 sccm, respectively. The processing times of the first, second, and third heat processes were set to be the same as those of PE4-5.

Present Example (PE)4-8

The first heat process was applied at 400° C., and the second heat process was then applied at 700° C., both at normal pressure, within a water vapor atmosphere the same as that of PE4-1. Then, the third heat process was applied at 850° C. and normal pressure as in the PE4-5, while nitrogen gas was supplied at a flow rate of 5000 sccm. The processing times of the first, second, and third heat processes were set to be the same as those of PE4-5.

Present Example (PE)4-9

The first heat process was applied at 400° C., and the second heat process was then applied at 600° C., both at normal pressure, within a water vapor atmosphere the same as that of PE4-1. Then, the third heat process was applied at 850° C. and normal pressure as in the PE4-5, while oxygen gas and nitrogen gas were supplied at flow rates of 1800 sccm and 4200 sccm, respectively. The processing times of the first, second, and third heat processes were set to be the same as those of PE4-5.

Present Example (PE)4-10

The first heat process was applied at 400° C., and the second heat process was then applied at 600° C., both at normal pressure, within a water vapor atmosphere the same as that of PE4-1. Then, the third heat process was applied at 850° C. and normal pressure as in the PE4-5, while nitrogen gas was supplied at a flow rate of 5000 sccm. The processing times of the first, second, and third heat processes were set to be the same as those of PE4-5.

FIG. 10 is a diagram showing peak areas due to Si—O bonds in the FT-IR spectrum of a polysilazane film, obtained by this experiment. In FIG. 10, the Si—O bond (I) area represents a wave number range of from 983 to 1320 cm$^{-1}$, the Si—O bond (II) area represents a wave number range of from 750 to 900 cm$^{-1}$, and the Si—O bond (III) area represents a wave number range of from 403 to 520 cm$^{-1}$. FIG. 10 also shows data on an SiO2 film formed by a deposition process. As the data is closer to that of the SiO$_2$ film, the skeleton of a polysilazane film is more similar to that of the SiO$_2$ film.

As shown in FIG. 10, the data on the peak areas due to Si—O bonds was closer to that of the SiO$_2$ film in the case where the first and second heat processes were applied (PE4-2 to 4-4), and the case where the first, second, and third heat processes were applied (PE4-5 to 4-10), as compared with the case where only the first heat process was applied (PE4-1). It means that the present examples PE4-2 to 4-4 and PE4-5 to 4-10 provided a polysilazane film having a skeleton closer to that of the SiO$_2$ film. Further, as the process temperature of the second heat process was higher, the data better matched that obtained from the SiO$_2$ film.

Where the temperature of the second heat process was at 700° C. or more, the peak areas due to Si—O bonds barely changed, depending on the third heat process being performed or not. Accordingly, it has been found that the first heat process and second heat process are critical to the structure of a polysilazane film. Where the temperature of the second heat process was at 600° C., subsequently performing the third heat process increased the peak areas due to Si—O bonds. This is thought to be that components based on OH groups which had not been removed by the second heat process were removed by the third heat process, thereby completing the structure of a polysilazane film. Further, in the present examples 4, the case where N$_2$ gas and O$_2$ gas were supplied in the third heat process showed larger peak areas due to Si—O bonds, as compared with the case where only N$_2$ gas was supplied.

Present Examples 5

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. Then, the polysilazane film was subjected to a SIMS analysis to measure the C-concentration, H-concentration, and N-concentration in the film. In this experiment, various heat process conditions were used for present examples in processing the polysilazane film, as follows.

Present Example (PE)5-1

The first heat process was applied for 30 minutes, at 400° C., and the second heat process was then applied for 30 minutes, at 800° C., both at normal pressure (101080 Pa), within a water vapor atmosphere (moisture concentration 80%). Then, the third heat process was applied for 30 minutes, at 850° C., while oxygen gas and nitrogen gas were supplied at flow rates of 1800 sccm and 4200 sccm, respectively.

Present Example (PE)5-2

Only the second heat process and third heat process were applied without the first heat process of the PE5-1. The process conditions of the second and third heat processes were set to be the same as those of PE5-1.

Figure 11:
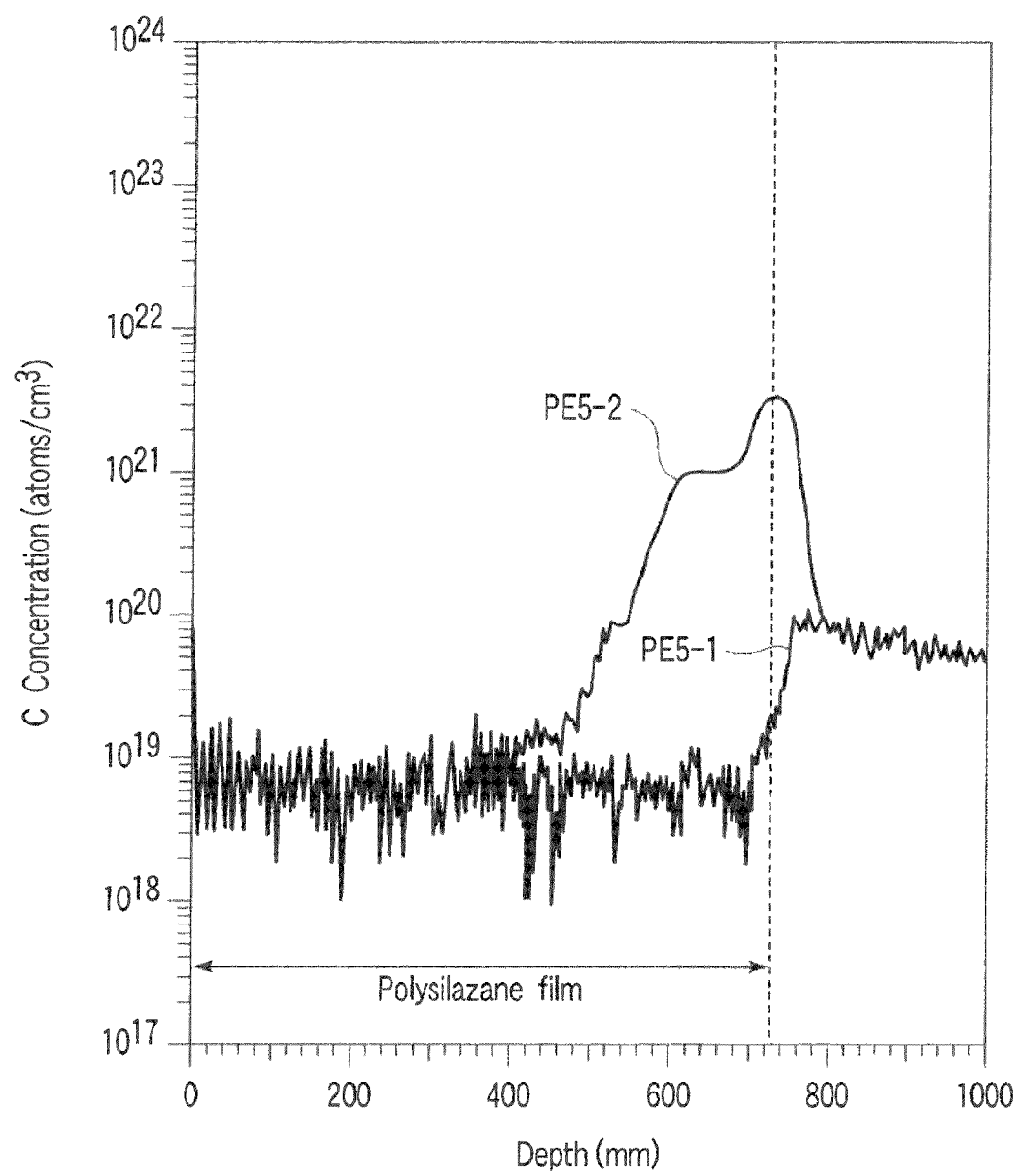
FIG. 11 is a characteristic diagram showing the C-concentration in a polysilazane film obtained by a SIMS analysis.

FIGS. 11, 12, and 13 are characteristic diagrams showing the C-concentration, H-concentration, and N-concentration, respectively, in a polysilazane film, obtained by a SIMS analysis. In FIGS. 11 to 13, the horizontal axis denotes depth in the film, and the vertical axis denotes the concentration.

As shown in FIGS. 11 to 13, all the C-concentration, H-concentration, and N-concentration were smaller in the polysilazane film formed under the conditions of the PE5-1 than the other. Accordingly, it has been found that a larger amount of carbon, hydrogen, and nitrogen can be removed from the film to form a polysilazane film containing a smaller quantity of impurities, where the first heat process, second heat process, and third heat process are performed stepwise. Furthermore, using the preliminary process before the first heat process as well as the conditions of the PE5-1, a polysilazane film was formed, and then subjected to a SIMS analysis in the same way. As a consequence, the polysilazane film showed spectrums similar to those of the film formed under the conditions of the PE5-1. Accordingly, it has been found that whether the preliminary process is performed or not has little influence on the impurity concentrations in a film.

Present Examples 6

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. At this time, a bare silicon wafer was placed along with the wafer W in the reaction container of the heat processing apparatus. The number of particles present on the bare silicon wafer was measured before and after the process, using a surface-defect detector "Surface Scan (product name)". The measurement target of particles was set at a diameter of 0.16 μm or more, over the enter wafer surface. In this experiment, different pressure conditions were used for present examples in processing the polysilazane film, as follows.

Present Example (PE)6-1

The first heat process was applied for 30 minutes, at 400° C., and the second heat process was then applied for 30 minutes, at 800° C., both at normal pressure (101080 Pa), within a water vapor atmosphere (moisture concentration 80%). Then, the third heat process was applied for 30 minutes, at 850° C., while oxygen gas and nitrogen gas were supplied at flow rates of 1800 sccm and 4200 sccm, respectively.

Present Example (PE)6-2

The same heat processes as the PE6-1 were applied under the same process conditions as the PE6-1, except that they were performed at a vacuum pressure (53200 Pa).

FIG. 14 is a diagram showing the relationship between the pressure condition in heat-processing and the number of deposited particles, obtained by this experiment. In FIG. 14, the horizontal axis denotes the pressure condition in heat-processing, and the vertical axis denotes the number of deposited particles on the wafer. As shown in FIG. 14, it has been found that the number of deposited particles on wafers is remarkably reduced where the heat processes are performed at a vacuum pressure in the reaction container.

Present Examples 7

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. At this time, a bare silicon wafer was placed along with the wafer W in the reaction container of the heat processing apparatus. The number of particles present on the bare silicon wafer was measured before and after the process, using the "Surface Scan". The measurement target of particles was set at a diameter of 0.16 μm or more, over the enter wafer surface. In this experiment, different atmospheres in the reaction container were used for present examples in loading the wafers into the reaction container, as follows.

Present Example (PE)7-1

The wafers were loaded into the reaction container, which was set to have a nitrogen atmosphere, and the same heat processes as the PE6-1 were applied under the same process conditions as the PE6-1.

Present Example (PE)7-2

The wafers were loaded into the reaction container, which was set to have an oxygen atmosphere, and the same heat processes as the PE6-1 were applied under the same process conditions as the PE6-1.

FIG. 15 is a diagram showing the relationship between the atmosphere in the reaction container in loading wafers into the reaction container and the number of deposited particles, obtained by this experiment. In FIG. 15, the horizontal axis denotes the atmosphere in the reaction container in loading the wafers, and the vertical axis denotes the number of deposited particles on the wafer. As shown in FIG. 15, it has been found that the number of deposited particles on wafers is remarkably reduced where the wafers are loaded into the reaction container, which is set to have an oxygen atmosphere.

Present Examples 8

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. At this time, a bare silicon wafer was placed along with the wafer W in the reaction container of the heat processing apparatus. The number of particles present on the bare silicon wafer was measured before and after the process, using the "Surface Scan". The measurement target of particles was set at a diameter of 0.16 μm or more, over the enter wafer surface. In this experiment, different temperatures in the reaction container were used for present examples in loading the wafers into the reaction container, as follows.

Present Example (PE)8-1

The wafers were loaded into the reaction container, the interior of which was set at a temperature of 400° C. or more, and the same heat processes as the PE6-1 were applied under the same process conditions as the PE6-1.

Present Example (PE)8-2

The wafers were loaded into the reaction container, the interior of which was set at a temperature of 200° C., and the same heat processes as the PE6-1 were applied under the same process conditions as the PE6-1.

FIG. 16 is a diagram showing the relationship between the temperature in the reaction container in loading wafers into the reaction container and the number of deposited particles, obtained by this experiment. In FIG. 16, the horizontal axis denotes the temperature in the reaction container in loading the wafers, and the vertical axis denotes the number of deposited particles on the wafer. As shown in FIG. 16, the case where the interior of the reaction container was set at a temperature of 200° C. in loading the wafers showed a far lower number of deposited particles, as compared with the case where it was set at a temperature of 400° C. or more. Accordingly, it has been found that the interior of the reaction container is preferably set at a temperature of 200° C. or less in loading wafers.

Present Examples 9

Wafers W were prepared such that a polysilazane coating film was applied to each of them and baked at 150° C. for 3 minutes. Then, the wafers W were loaded into the heat processing apparatus described above and subjected to a baking process to obtain a polysilazane film. Then, the dielectric constant of the polysilazane film was measured to examine the film quality. In this experiment, different pressure conditions (a normal pressure atmosphere and a vacuum pressure atmosphere) were used for present examples in processing the polysilazane film, as follows.

Present Example (PE)9-1

The first heat process was applied for 30 minutes, at 400° C., and the second heat process was then applied for 30 minutes, at 700° C., both at normal pressure (101080 Pa), within a water vapor atmosphere (80%). Then, the third heat process was applied for 30 minutes, at 850° C., while nitrogen gas was supplied at a flow rate of 5000 sccm.

Present Example (PE)9-2

The first to third heat processes were applied under the same process conditions as those of the PE9-1, except that they were performed at a vacuum pressure (53200 Pa).

FIG. 17 is a diagram showing the relationship between the pressure condition in heat-processing and the dielectric constant of a polysilazane film, obtained by this experiment. In FIG. 17, the horizontal axis denotes the pressure condition in heat-processing, and the vertical axis denotes the dielectric constant. As shown in FIG. 17, the dielectric constant of a formed polysilazane film barely changed, depending on the pressure condition being a normal pressure atmosphere or vacuum pressure atmosphere. Further, the polysilazane film was subjected to an FT-IR analysis, and confirmed that the peaks due to components based on OH groups were almost the same. Accordingly, it has been found that the pressure condition in heat-processing has little influence on the quality of a polysilazane film.

As a modification of the embodiment described above, ozone may be supplied into the reaction container to perform the preliminary process, first heat process, and second heat process in an ozone atmosphere, instead of a water vapor atmosphere. Alternatively, oxygen gas and hydrogen gas may be separately supplied into the reaction container at a vacuum pressure to generate mainly hydrogen radicals and hydroxyl group radicals at a pressure near 1 Torr, so as to perform the preliminary process, first heat process, and second heat process in an oxidizing atmosphere, instead of a water vapor atmosphere. A polysilazane film thus baked may be used as a device isolation film or inter-level insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. An apparatus for processing a polysilazane film, comprising:
   a reaction container having a process area configured to accommodate a plurality of target substrates placed at intervals in a vertical direction, the target substrates being provided with a polysilazane coating film formed thereon;
   a heater configured to heat the process area;
   an exhaust system configured to exhaust the reaction container;
   a supply system configured to supply a process gas into the reaction container, the supply system including a portion configured to supply water vapor into the reaction container; and
   a controller configured to control an operation of the apparatus,
   wherein the controller includes a process recipe and control program both stored in the controller such that the control program causes the controller to read the process recipe and control the apparatus to conduct a baking sequence of baking the polysilazane coating film, the baking sequence including a first heat process, a second heat process, and a third heat process sequentially applied onto the polysilazane coating film in this order;
   the first heat process being formed while supplying water vapor into the process area, while setting the process area and setting the process area at a first temperature of from 390° C. to 410° C.;
   the second heat process being formed while supplying water vapor into the process area and setting the process area at a second temperature of from 600° C. to 800° C.; and
   the third heat process being performed while setting the process area at a third temperature of from 800° C. to 1000° C.,
   wherein the first and second heat process are directly connected to each other by a first heating-up period and the second and third heat processes are directly connected to each other by a second heating-up period such that each of the first and second heating-up period is arranged to increase temperature of the process area with time without a temperature decrease halfway therethrough, and
   the process area is kept vacuum-exhausted to a vacuum pressure of from 133 to 93,100 Pa over the first, second, and third heat processes.

2. The apparatus according to claim 1, wherein the baking sequence further includes a preliminary process applied onto the polysilazane coating film prior to the first heat process, wherein the preliminary process is performed while supplying water vapor into the process area and setting the process area at a preliminary temperature lower than the first temperature.

3. The apparatus according to claim 1, wherein the supply system includes a water vapor generator disposed outside the reaction container and configure to cause oxygen gas and hydrogen gas to react with each other to generate water vapor.

4. The apparatus according to claim 1, wherein the third heat process is performed while not supplying water vapor into the process area after replacing gas within the process area with nitrogen gas.

5. The apparatus according to claim 4, wherein the third heat process is performed while further supplying oxygen into the process area.

6. The apparatus according to claim 1, wherein the third heat process is performed while forming a water vapor atmosphere in the process area.

7. An apparatus for processing a polysilazane film, comprising:
a reaction container having a process area configured to accommodate a target substrate with a polysilazane coating film formed thereon;
a heater configured to heat the process area;
an exhaust system configured to exhaust the reaction container;
a supply system configured to supply a process gas into the reaction container, the supply system including a portion configured to supply water vapor into the reaction container; and
a controller configured to control an operation of the apparatus,
wherein the controller includes a process recipe and control program both stored in the controller such that the control program causes the controller to read the process recipe and control the apparatus to conduct a baking sequence of baking the polysilazane coating film, the baking sequence including a first heat process, a second heat process, and a third heat process sequentially applied onto the polysilazane coating film in this order;
the first heat process being performed for 5 to 60 minutes while supplying water vapor into the process area, setting the process area at a first temperature of from 390° C. to 410° C., and vacuum-exhausting the process area to a vacuum pressure of from 133 to 93,100 Pa;
the second heat process being performed for 5 to 60 minutes while supplying water vapor into the process area, setting the process area at a second temperature of from 600° C. to 800° C., and vacuum-exhausting the process area to a vacuum pressure of from 133 to 93,100 Pa, and
the third heat process being performed for 5 to 60 minutes while setting the process area at a third temperature of from 800° C. to 1000° C. and vacuum-exhausting the process area to a vacuum pressure of from 133 to 93,100 Pa,
wherein the first and second heat processes are directly connected to each other by a first heating-up period and the second and third heat processes are directly connected to each other by a second heating-up period such that each of the first and second heating-up period is arranged to increase temperature of the process area with time without a temperature decrease halfway therethrough.

8. The apparatus according to claim 7, wherein the baking sequence further includes a preliminary process applied onto the polysilazane coating film prior to the first heat process, wherein the preliminary process is performed while supplying water vapor into the process area and setting the process area at a preliminary temperature lower than the first temperature, and exhausting the process area to a vacuum pressure of from 133 to 93,100 Pa.

9. The apparatus according to claim 7, wherein the supply system includes a water vapor generator disposed outside the reaction container and
configure to cause oxygen gas and hydrogen gas to react with each other to generate water vapor.

10. The apparatus according to claim 7, wherein the third heat process is performed while not supplying water vapor into the process area after replacing gas within the process area with nitrogen gas.

11. The apparatus according to claim 10. wherein the third heat process is performed while further supplying oxygen into the process area.

12. The apparatus according to claim 7, wherein the third heat process is performed while forming a water vapor atmosphere in the process area.

* * * * *